United States Patent
Fujii

(10) Patent No.: US 7,660,130 B2
(45) Date of Patent: Feb. 9, 2010

(54) SEMICONDUCTOR DEVICE

(75) Inventor: Seiya Fujii, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/331,709

(22) Filed: Dec. 10, 2008

(65) Prior Publication Data

US 2009/0154125 A1   Jun. 18, 2009

(30) Foreign Application Priority Data

Dec. 13, 2007   (JP) .............................. 2007-321751

(51) Int. Cl.
*H05K 7/02* (2006.01)
*H05K 7/06* (2006.01)
*H05K 7/08* (2006.01)
*H05K 7/10* (2006.01)

(52) U.S. Cl. ...................... 361/783; 361/760; 361/777; 361/784

(58) Field of Classification Search ......... 361/760–762, 361/777, 782–784, 795; 174/258–264; 257/778–780
See application file for complete search history.

(56) References Cited

U.S. PATENT DOCUMENTS 5,859,474 A * 1/1999 Dordi ........................ 257/737
6,303,878 B1 * 10/2001 Kondo et al. ............... 174/261
6,400,018 B2 * 6/2002 Clatanoff et al. ............ 257/737
6,400,019 B1 * 6/2002 Hirashima et al. .......... 257/737
7,456,493 B2 * 11/2008 Murata et al. .............. 257/676

FOREIGN PATENT DOCUMENTS

JP   2001-230513   8/2001

* cited by examiner

*Primary Examiner*—Tuan T Dinh
(74) *Attorney, Agent, or Firm*—Young & Thompson

(57) ABSTRACT

A semiconductor device includes: a wiring substrate including multiple connection pads provided on a top surface thereof and multiple lands that are provided on a bottom surface thereof and electrically connected to the corresponding connection pads; a semiconductor chip mounted on the top surface of the wiring substrate and electrically connected to the connection pads; a solder resist deposited on the bottom surface of the wiring substrate and having multiple openings to which the lands are respectively exposed, each of the openings being shifted with respect to a corresponding land of the lands; multiple external terminals connected respectively to the lands through the openings; and a dummy wiring arranged on the bottom surface of the wiring substrate and separately from the corresponding land so that a corresponding external terminal of the external terminals is connected to the corresponding land and the dummy wiring partially exposed to the corresponding opening.

6 Claims, 7 Drawing Sheets

SEMICONDUCTOR DEVICE

BACKGROUND OF THE INVENTION

1. Field of the Invention

The present invention relates to a semiconductor device formed by a semiconductor chip being mounted on a package substrate, and to an electronic device including the semiconductor device.

Priority is claimed on Japanese Patent Application No. 2007-321751, filed Dec. 13, 2007, the content of which is incorporated herein by reference.

2. Description of the Related Art

Recently, greater miniaturization and multi-layering of wirings have been progressing with the higher integration of semiconductor chips. On the other hand, miniaturization of the package size is required for high-density packaging of a semiconductor package (semiconductor device). For example, a semiconductor package, such as BGA (ball grid array) and CSP (chip size package), has a structure in which a semiconductor chip is mounted on a package substrate, and the semiconductor chip and the package substrate are connected using, for example, wire bonding. In this case, solder balls for external connection can be arranged at the rear surface of the package substrate. Thereby, the semiconductor package is applicable to multiple pins.

A conventional BGA-type semiconductor device mainly includes a wiring substrate (package substrate) having multiple connection pads provided on the top surface thereof and multiple lands provided on the bottom surface thereof and electrically connected to the connection pads, a semiconductor chip mounted on the top surface of the wiring substrate, wirings to electrically connect electrode pads provided on the semiconductor chip and the connection pads, a seal made of an insulating resin and covering the semiconductor chip and the wirings, and external terminals provided on the lands.

The conventional BGA-type semiconductor device is mounted on compact electronic devices, such as a cellular phone, and therefore required to withstand stress due to a difference in thermal expansion coefficients between the wiring substrate and the semiconductor chip, and mechanical impact, such as when an electronic device is dropped.

However, a solder ball 108 arranged at a corner K' of a wiring substrate 102 is likely to fracture as shown in FIG. 9. As shown in FIG. 10, the solder ball 108 is subjected to stress from a solder resist 106 at the corner K', and the solder ball 108 cracks in the vicinity of a land 104 on the corner K' side since the solder ball 108 is damaged by stress caused by a difference in thermal expansion coefficients between a semiconductor chip and a wiring substrate or a resin, or by impact applied to the solder ball 108 arranged at the outermost alignment. Accordingly, connection of the solder ball 108 in the vicinity of the corner K' is required to be strengthened to enhance the reliability of a secondary mounting of a semiconductor device. Advancement of damage depends on the structure of a semiconductor device, and therefore has directionality. Therefore, countermeasures are required.

For example, Japanese Unexamined Patent Application, Fast Publication No. 2001-230513 discloses a technique of increasing connection strength of solder balls to prevent damage or crack in the balls. Specifically, an opening of a solder resist is intentionally shifted with respect to a land having an SMD (solder mask defined) structure so that a side surface of the land is exposed to be NSMD (non-solder mask defined), and thereby the connection strength is enhanced.

However, the connection strength is enhanced to some extent, but still not enough in the technique since only the connection strength of conventional NSMD structures can be achieved by the solder resist being shifted to expose the side surface of the land. The connection strength needs to be further enhanced for products requiring greater connection strength than that of the conventional NSMD structure.

SUMMARY

In one embodiment, there is provided a semiconductor device that may include: a wiring substrate including multiple connection pads provided on a top surface thereof and multiple lands that are provided on a bottom surface thereof and electrically connected to the corresponding connection pads; a semiconductor chip mounted on the top surface of the wiring substrate and electrically connected to the connection pads; a solder resist deposited on the bottom surface of the wiring substrate and having multiple openings to which the lands are respectively exposed, each of the openings being shifted with respect to a corresponding land of the lands; multiple external terminals connected respectively to the lands through the openings; and a dummy wiring arranged on the bottom surface of the wiring substrate and separately from the corresponding land so that a corresponding external terminal of the external terminals is connected to the corresponding land and the dummy wiring partially exposed to the corresponding opening.

According to the semiconductor device, the resistance against cracking of solder balls can be enhanced. Thereby, the connection strength of the solder balls and the reliability of a secondary mounting of the semiconductor device can be enhanced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. The accompanying drawings explain a semiconductor device and a method of forming the same in the embodiments, and the size, the thickness, and the like of each illustrated portion might be different from those of each portion of an actual semiconductor device and an actual electronic device.

Those skilled in the art will recognize that many alternative embodiments can be accomplished using the teachings of the present invention, and that the invention is not limited to the embodiments illustrated herein for explanatory purpose.

Hereinafter, a first embodiment of the present invention is explained.

Figure 1A:
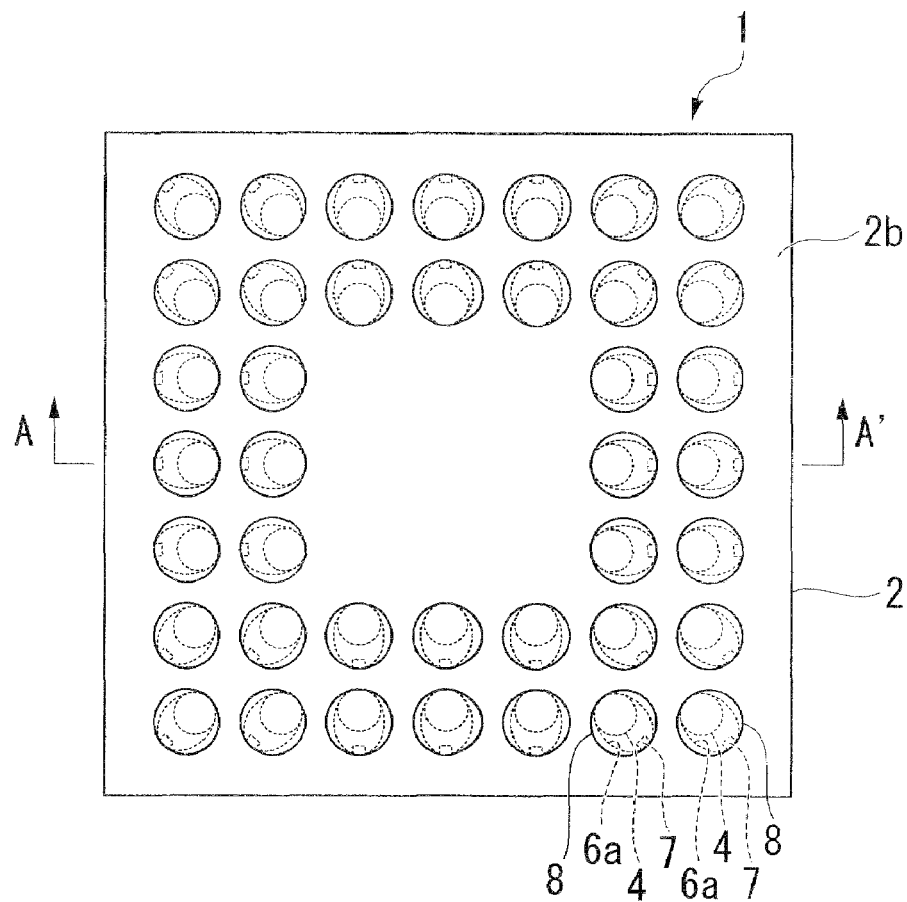
FIG. 1A is a plane view showing the structure of external terminals of a semiconductor device according to a first embodiment of the present invention.
Figure 1B:
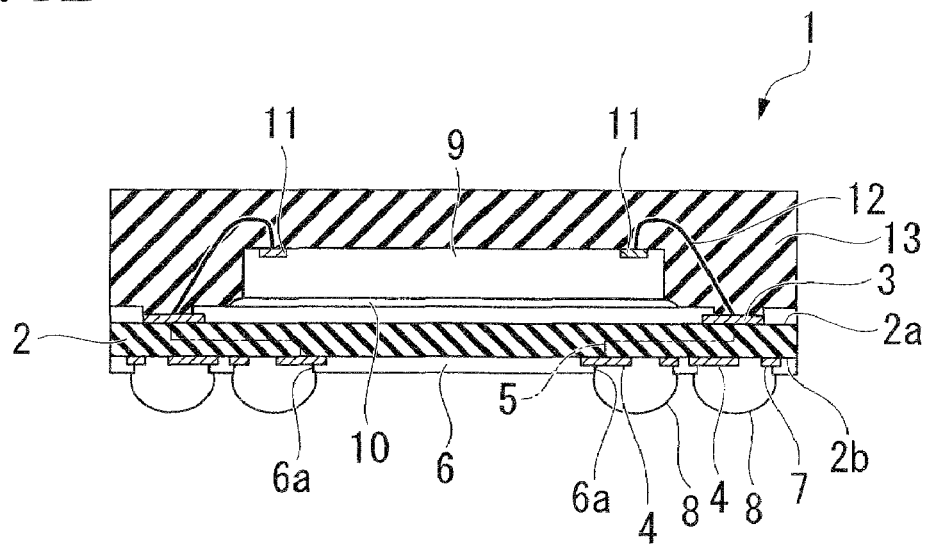
FIG. 1B is a cross-sectional view taken along a line A-A' shown in FIG. 1A.
Figure 2A:
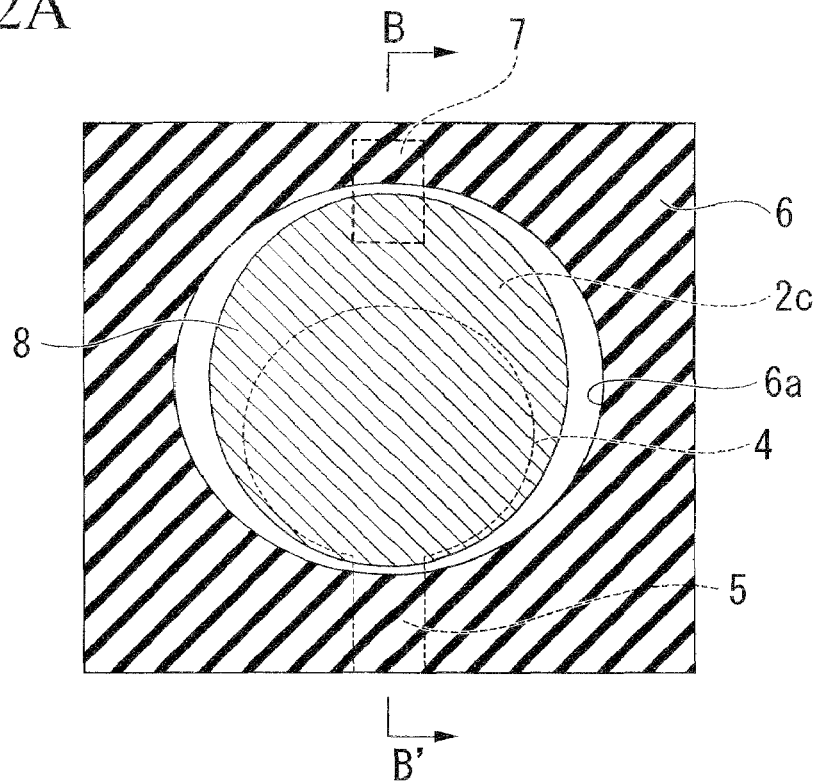
FIG. 2A is a plane view showing the land structure of the semiconductor device.
Figure 2B:
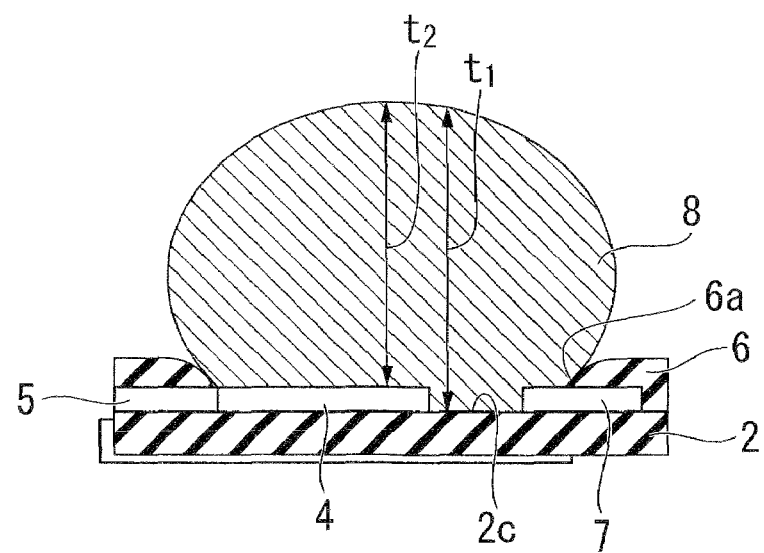
FIG. 2B is a cross-sectional view taken along a line B-B' shown in FIG. 2A.

FIG. 1A is a plane view showing the structure of external terminals of a BGA-type semiconductor device 1 according to the first embodiment of the present invention. FIG. 1B is a cross-sectional view taken along a line A-A' shown in FIG. 1A. FIG. 2A is a plane view showing the land structure of the semiconductor device 1. FIG. 2B is a cross-sectional view taken along a line B-B' shown in FIG. 2A.

As shown in FIG. 1A, the semiconductor device 1 includes a wiring substrate 2 in substantially a rectangular shape, on which wirings are provided. The wiring substrate 2 is, for example, a glass epoxy substrate of 0.25 mm on which wirings are provided. As shown in FIG. 1B, multiple connection pads 3 are provided on the top surface 2a of the wiring substrate 2. Multiple lands 4 are provided in a grid on the bottom surface of the wiring substrate 2. The lands 4 are electrically connected to the corresponding connection pads 3 by wirings 5 provided in the wiring substrate 2. A solder resist 6 is deposited on the bottom surface 2b of the wiring substrate 2, and has openings 6a.

As shown in FIGS. 2A and 2B, the opening 6a of the solder resist 6 is shifted with respect to the land 4 at the portion where the land 4 is provided. That is, the opening 6a is larger than the land 4. The center of the opening 6a is shifted from the center of the land 4. The opening 6a is shifted by, for example, 10 to 20 µm toward a portion on which stress applied to the external terminals is focused, for example, toward the four corners or the outer edges of the wiring substrate 2. The land 4 is exposed to the opening 6a. A dummy wiring 7 is provided at a position on which stress at the opening 6a is focused, i.e., a position furthest from the land 4 at the opening 6a in the case of FIG. 2A. The dummy wiring 7 is provided on the bottom surface 2b of the wiring substrate 2 and partially exposed to the opening 6a.

Solder balls 8 that will be external terminals are mounted on the lands 4, respectively. The external terminals are arranged at a given pitch in a grid. The solder ball 8 straddles the land 4 and the dummy wiring 7 because of the opening 6a being shifted, and thereby is thicker at the position on which stress is focused. Additionally, the solder ball 8 is connected to an exposed portion 2c of the wiring substrate 2 which is exposed between the land 4 and the dummy wiring 7 and located at the position on which stress applied to the solder ball 8 is focused. As a result, a thickness $t_1$ of the solder ball 8 at the exposed portion 2c is thicker than a thickness $t_2$ thereof at the land 4 by the thickness of the land 4, making the solder ball 8 unlikely to crack. Further, the land 4 and the dummy wiring 7 are separated from each other at the opening 6a, and thereby not likely to cause the solder ball 8 to crack. Therefore, advancement of damage can be delayed.

A semiconductor chip 9 is fixed on substantially the center of the top surface 2a of the wiring substrate 2 by an insulating adhesive 10. For example, a logic circuit or a memory circuit is provided on the semiconductor chip 9. Multiple electrode pads 11 are provided on the circumference of the semiconductor chip 9.

The electrode pads 11 on the semiconductor chip 9 are electrically connected to the corresponding connection pads 3 by conductive wirings 12. The wirings 12 are made of, for example, Au, Cu, or Al.

A seal 13 covering the semiconductor chip 9 and the wirings 12 is provided on the top surface 2a of the wiring substrate 2. The seal 13 is made of, for example, a thermosetting resin, such as an epoxy resin.

Figure 3:
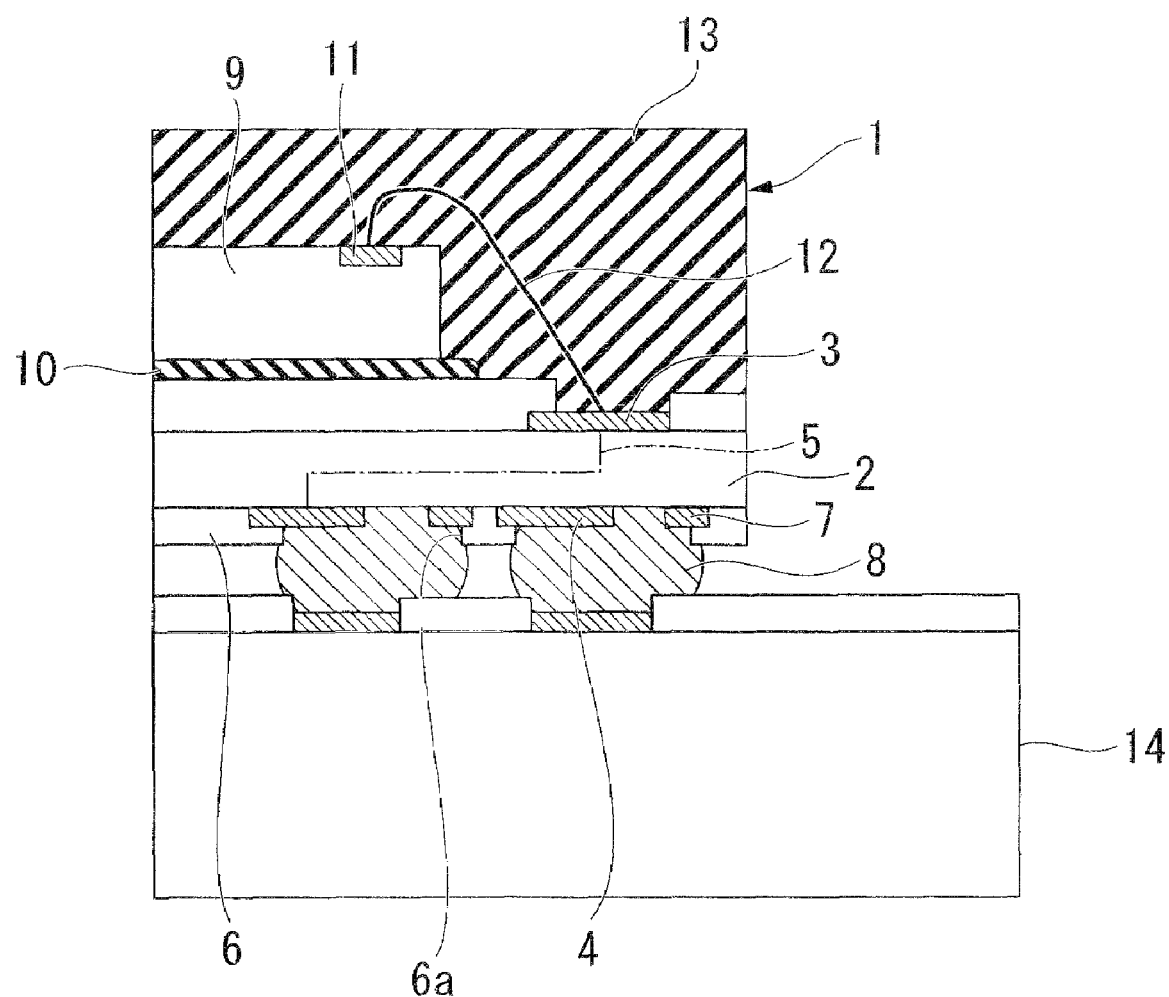
FIG. 3 is a cross-sectional view showing a state of the semiconductor device being mounted on a mounting substrate of an electronic device.

As shown in FIG. 3, the semiconductor device can be mounted on a mounting substrate 14 of an electronic device so that the solder balls 8 on the edge sides of the wiring substrate 2 on which stress is focused become thicker. Therefore, the reliability of a secondary mounting of the semiconductor device 1 can be enhanced.

Thus, the openings 6a of the solder resist 6 at portions on which damages to the wiring substrate 2 and the mounting substrate 14 are focused are intentionally shifted with respect to the lands 4. As a result, the solder balls 8 are shifted with respect to the lands 4 because of the openings 6a being shifted, and mounted on the lands 4. Thereby, the solder balls 8 at portions on which damages are focused become thicker, enhancing the resistance.

Additionally, the dummy wirings 7 are provided in the shifting direction of the solder resist 6 and the solder balls 8, and thereby the connection strength between the shifted solder balls 8 and the wirings 5 (wiring substrate 2) can be enhanced. Further, the land 4 and the dummy wiring 7 are separated from each other at the opening 6a, and thereby not likely to cause the solder ball 8 to crack. Therefore, advancement of damage can be delayed. Moreover, the dummy wiring 7 is provided to fix a part of the solder ball 8, and thereby the connection area of the wiring substrate 2 and the solder ball 8 can be increased.

As a result, the resistance against crack and damage increases, and the reliability of the entire package can be enhanced.

Hereinafter, a method of forming the semiconductor device 1 according to the first embodiment is explained. The method mainly includes a die bonding process of setting semiconductor chips on product forming sections of a wiring motherboard, a wire bonding process of connecting electrode pads on the semiconductor chips and connection pads on the wiring motherboard using wirings, a molding process of forming a seal collectively covering multiple product forming sections, a ball mounting process of mounting solder balls on the bottom surface of the wiring motherboard to form external terminals, and a board dicing process of cutting the wiring motherboard along dicing lines into pieces for each product forming section.

Hereinafter, each process of the method of forming the semiconductor device 1 is explained with reference to FIGS. 4A to 4E.

Figure 4A:
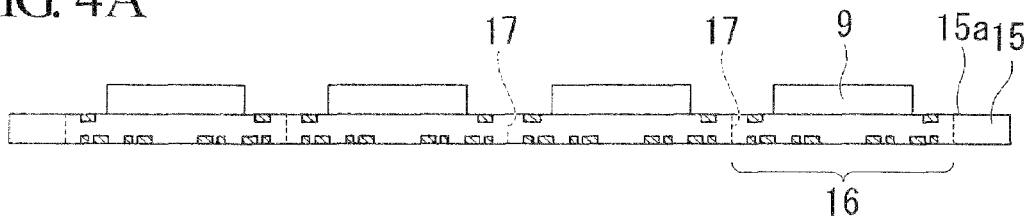
FIGS. 4A to 4E are cross-sectional views indicative of a process flow showing a method of forming the semiconductor device.

As shown in FIG. 4A, a wiring motherboard 15 to be used in the method of forming the semiconductor device 1 is made of, for example, a glass epoxy board and includes multiple product forming sections 16.

The product forming sections 16 are arranged in a matrix. Boundaries among the product forming sections 16 are dicing lines 17. The product forming sections 16 are cut along the dicing lines 17 and separated into multiple pieces, and each piece becomes the aforementioned wiring substrate 2. Each product forming section 16 has the same structure as that of the wiring substrate 2, and includes multiple connection pads 3 on the top surface 15a of the wiring motherboard 15 and on the circumference of a portion on which the semiconductor chip 9 is mounted, and multiple lands 4 arranged in a grid and on the bottom surface 2b thereof. As explained above, each opening 6a of the solder resist 6 where the land 4 is arranged is shifted with respect to the land 4 toward a portion, such as the corners or the outer edges of the wiring substrate 2, on which stress is focused. Additionally, the dummy wiring 7 is provided at a portion opposing the land 4 at the opening 6a.

In the die bonding process, the semiconductor chip 9 is fixed onto the center of the top surface of each product forming section 16 of the wiring motherboard 15 as shown in FIG. 4A. The semiconductor chip 9 is fixed onto the product forming section 16 through, for example, an insulating adhesive by a non-depicted die bonding apparatus.

Figure 4B:
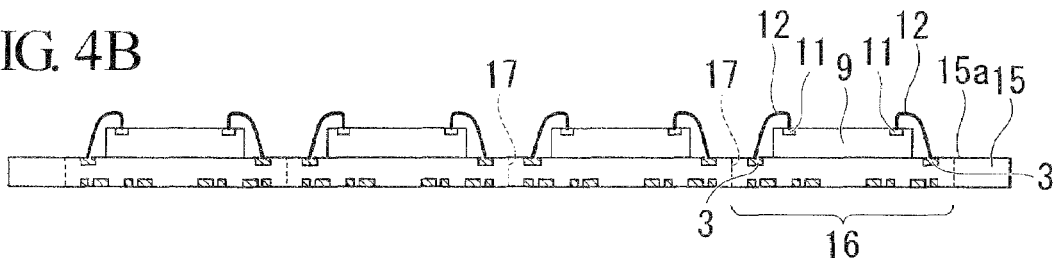

In the wire bonding process, the electrode pads 11 are connected to the corresponding connection pads 3 on the wiring substrate 2 using the conductive wirings 12 made of, for example, Au, as shown in FIG. 4B. The wiring 12 which is melted to form a ball at one end thereof is connected to the electrode pad 11 by ultrasonic thermocompression using a non-depicted wire bonding apparatus. Then, the wiring 12 is made in a given loop shape, and the other end of the wiring 12 is connected to the connection pad 3 on the wiring substrate 2 by ultrasonic thermocompression. All of the electrode pads 11 are connected to the corresponding connection pads 3 by the wirings 12.

Figure 4C:
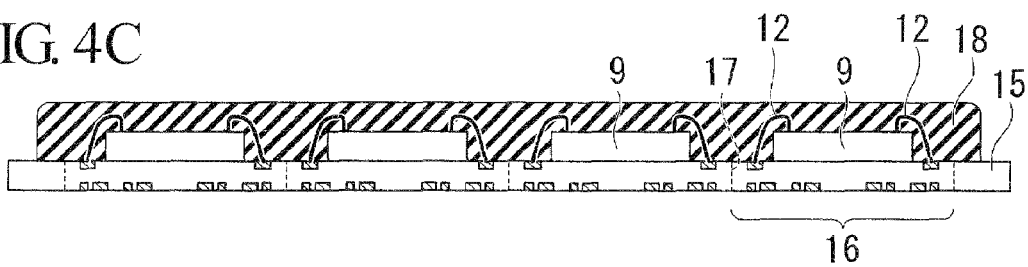

In the molding process, the wiring motherboard 15 is clamped using upper and lower molds of a non-depicted transfer molding apparatus, and a cavity formed by the upper and lower molds is filled with a melted seal resin, such as a thermosetting epoxy resin. Then, the seal resin is thermally cured, and the seal 18 that collectively covers all of the product forming sections 16 is formed as shown in FIG. 4C. The seal 18 can be efficiently formed with the use of the collective molds.

Figure 4D:
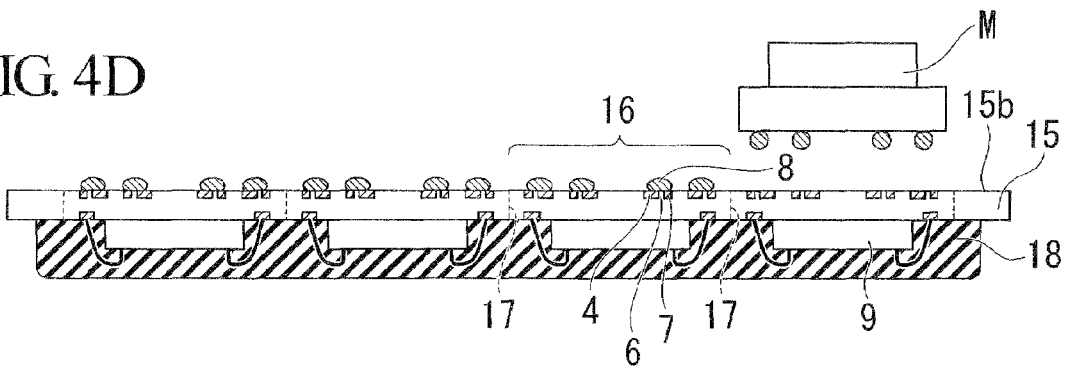

In the ball mounting process, solder balls 8 are mounted on the lands 4 on the bottom surface 15b of the wiring motherboard 15 to form external terminals as shown in FIG. 4D. For example, a non-depicted mounting tool M that is a ball mounter is used to vacuum the solder balls 8 and mount the solder balls 8 on the lands 4 through flux. Then, reflow is performed, and thereby the solder balls 8 are connected onto the lands 4 as shown in FIG. 4D. Since the opening 6a is shifted with respect to the land 4 toward a portion on which stress is focused, and the dummy wiring 7 separated from the land 4 is provided at the opening 6a, the solder ball 8 straddles the land 4 and the dummy wiring 7. As a result, the external terminals can be configured to be thicker at the portions on which stress is focused.

Figure 4E:
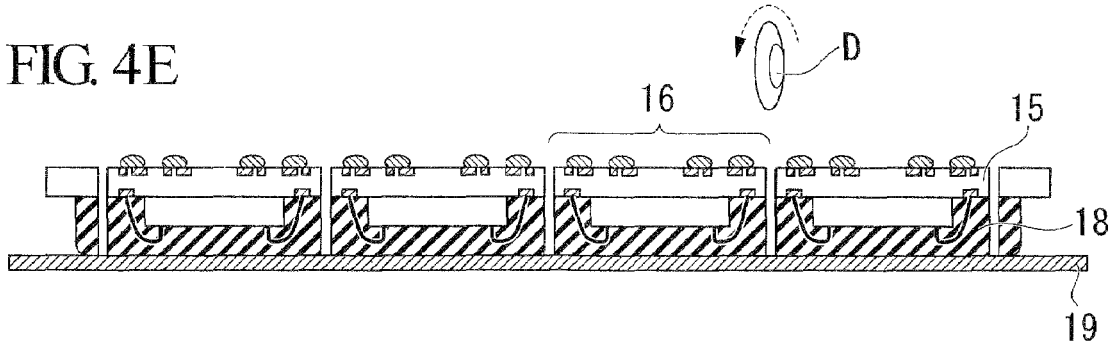

In the board dicing process, the seal 18 is bonded onto a dicing tape 19, and the wiring motherboard 15 is cut into pieces along the dicing lines 17 using a dicing blade 21 rotating at high speed, and the product forming sections 16 are separated as shown in FIG. 4E. Then, each piece is picked up from the dicing tape 19 to acquire the semiconductor device 1 shown in FIG. 1.

Hereinafter, a second embodiment of the present invention is explained.

Figure 5:
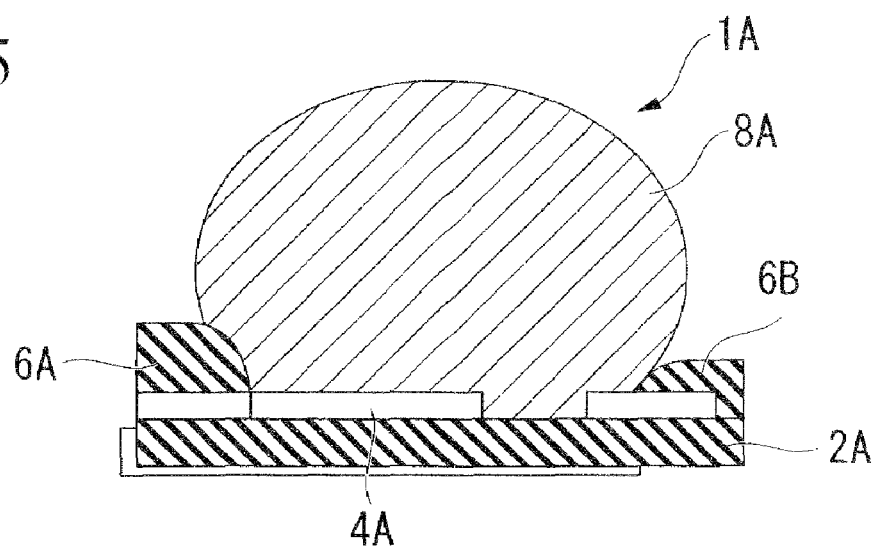
FIG. 5 is a cross-sectional view showing the land structure of a semiconductor device according to a second embodiment of the present invention.

FIG. 5 is a cross-sectional view showing the land structure of a semiconductor device 1A according to the second embodiment of the present invention. To further enhance the reliability with respect to portions of a wiring substrate 2A and a mounting substrate 14A on which damage is focused, the thickness of a solder resist 6 on the circumference of a land 4A is arbitrarily changed so that the solder resist 6B on the side of a portion on which stress is focused becomes thinner than the solder resist 6A, for example. As a result, the solder ball 8 is shifted because of the difference in the thicknesses of the solder resists 6A and 6B. Thereby, the thickness of the portion on which damage is focused can be thicker. As a result, the resistance against cracking increases, and the reliability of the entire package can be enhanced. The thickness of the solder resist can be adjusted by providing asperity to a jig used for planarization of the solder resist 6.

Hereinafter, a third embodiment of the present invention is explained.

Figure 6:
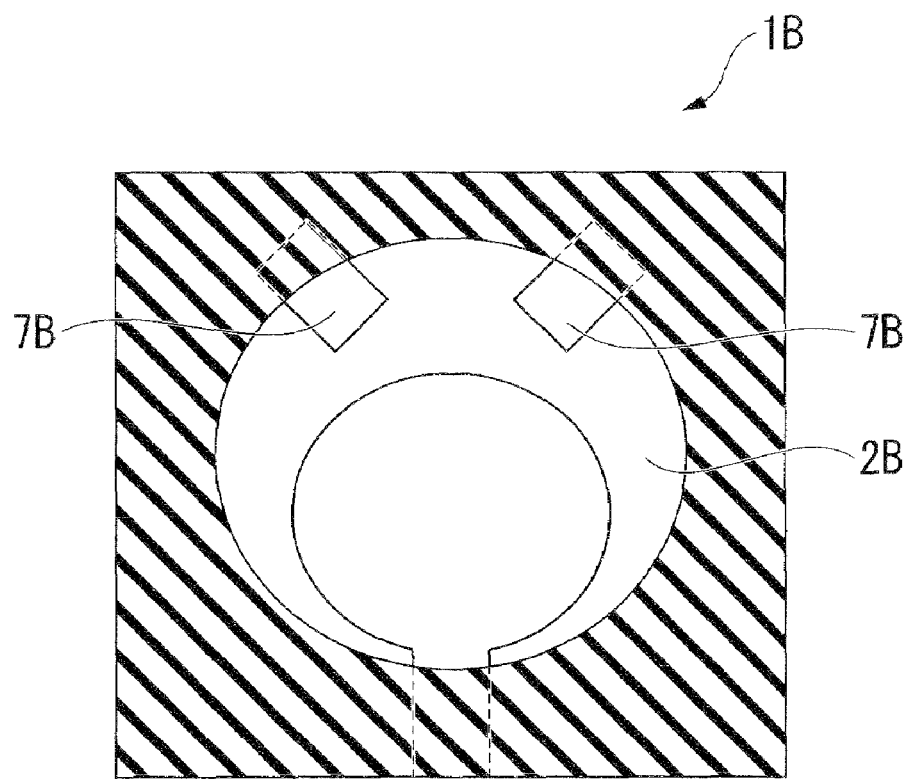
FIG. 6 is a plan view showing the land structure of a semiconductor device according to a third embodiment of the present invention.

FIG. 6 is a plane view showing the land structure of a semiconductor device 1B according to the third embodiment of the present invention. As shown in FIG. 6, multiple dummy wirings 7B are provided so that the connection area of the wiring substrate 2B and the solder ball is further increased.

Hereinafter, a fourth embodiment of the present invention is explained.

Figure 7:
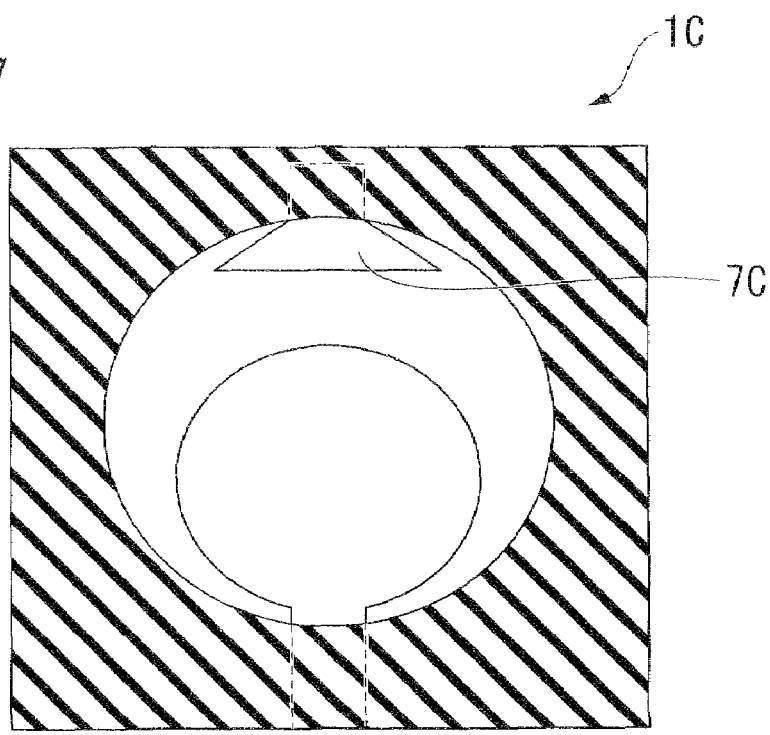
FIG. 7 is a cross-sectional view showing the land structure of a semiconductor device according to a fourth embodiment of the present invention.

FIG. 7 is a plane view showing the land structure of a semiconductor device 1C according to the fourth embodiment of the present invention. As shown in FIG. 7, an edge portion of a dummy wiring 7C may be widened so that the connection area is further increased.

Hereinafter, a fifth embodiment of the present invention is explained.

Figure 8:
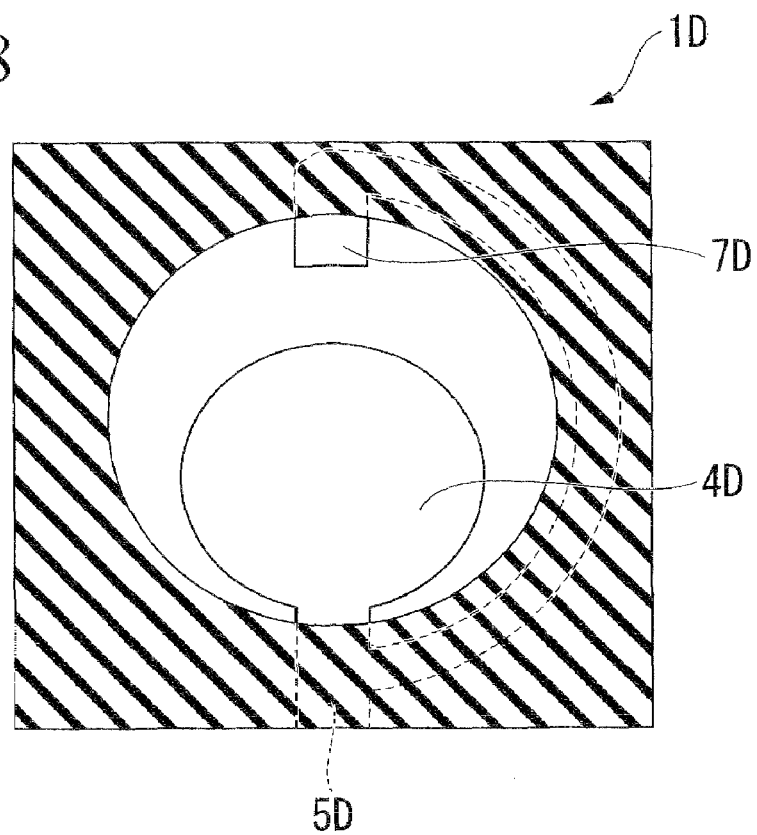
FIG. 8 is a cross-sectional view showing the land structure of a semiconductor device according to a fifth embodiment of the present invention.
Figure 9:
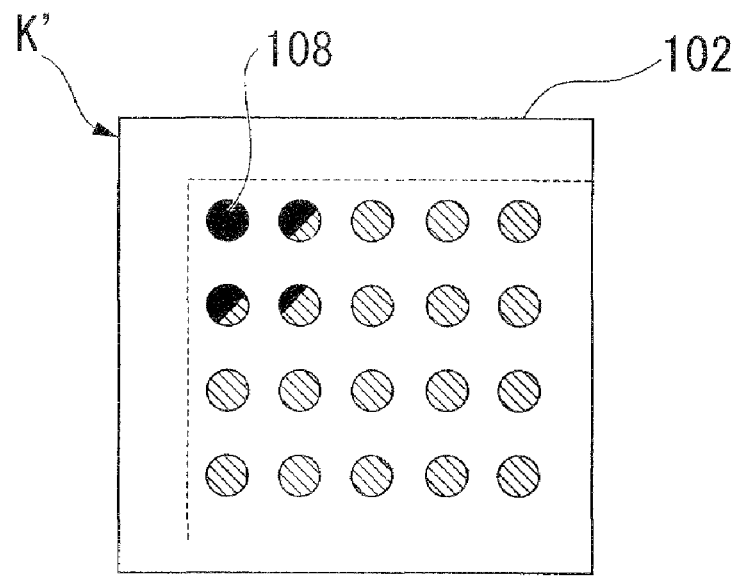
FIG. 9 is a plane view showing a conventional semiconductor device.
Figure 10:
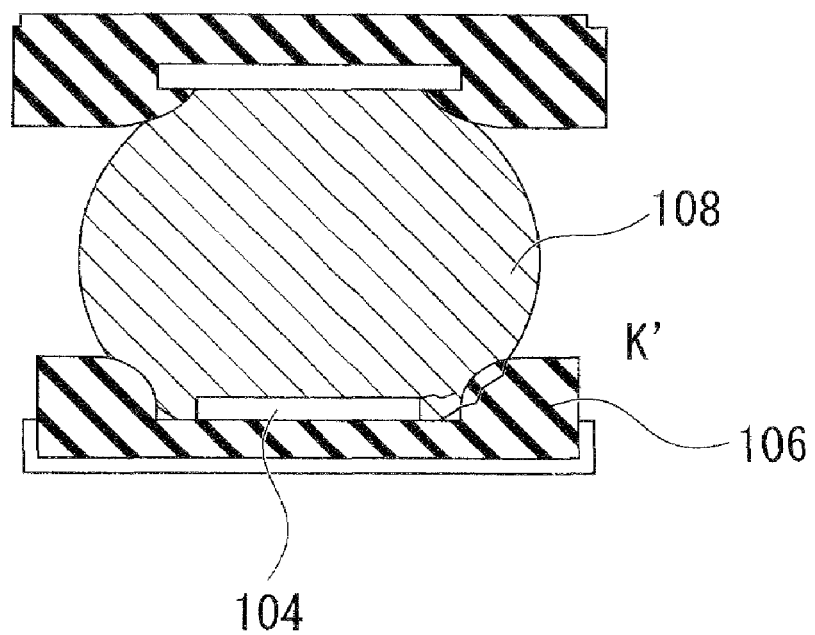
FIG. 10 is a cross-sectional view showing the conventional semiconductor device.

FIG. 8 is a plane view showing the land structure of a semiconductor device 1C according to the fifth embodiment of the present invention. As shown in FIG. 8, a dummy wiring 7D may be connected to a wiring 5D connected to a land 4D as a spare wiring so that the reliability between a solder ball 8D and the land 4D (wiring) is increased. As a result, the electrical connection can be maintained even when the neck of the land 4D is broken.

Although the BGA-type semiconductor device is explained, the present invention is applicable to an LGA (land grid array), an MCP (multiple-chip package), a flip chip, and the like.

The present invention can widely be used for a semiconductor device in which a semiconductor chip is mounted on a package substrate, and an electronic device including the semiconductor device.

It is apparent that the present invention is not limited to the above embodiments, but may be modified and changed without departing from the scope and spirit of the invention.

What is claimed is:

1. A semiconductor device, comprising:
    a wiring substrate including a plurality of connection pads provided on a top surface thereof and a plurality of lands that are provided on a bottom surface thereof and electrically connected to the corresponding connection pads;
    a semiconductor chip mounted on the top surface of the wiring substrate and electrically connected to the connection pads;
    a solder resist deposited on the bottom surface of the wiring substrate and having a plurality of openings to which the lands are respectively exposed, each of the openings being shifted with respect to a corresponding land of the lands;
    a plurality of external terminals connected respectively to the lands through the openings; and
    a dummy wiring arranged on the bottom surface of the wiring substrate and separately from the corresponding land so that a corresponding external terminal of the external terminals is connected to the corresponding land and the dummy wiring partially exposed to the corresponding opening.

2. The semiconductor device according to claim 1, wherein the solder resist on the circumference of each of the openings is thinner on a side of the dummy wiring than that on a side of the corresponding land.

3. The semiconductor device according to claim 1, wherein each of the openings is shifted with respect to the corresponding land toward corners and outer edges of the wiring substrate.

4. The semiconductor device according to claim 1, wherein a plurality of dummy wirings are arranged on the bottom surface of the wiring substrate and separately from the corresponding land so that the corresponding external terminal is connected to the corresponding land and the dummy wirings partially exposed to the corresponding opening.

5. The semiconductor device according to claim 1, wherein an edge portion of the dummy wiring is widened.

6. The semiconductor device according to claim 1, wherein the dummy wiring is connected to a wiring connected to the corresponding land.

* * * * *